(12) United States Patent
Chang et al.

(10) Patent No.: US 8,841,001 B2
(45) Date of Patent: Sep. 23, 2014

(54) DEVICE HOUSING AND METHOD FOR MAKING SAME

(75) Inventors: Hsin-Pei Chang, New Taipei (TW);
Wen-Rong Chen, New Taipei (TW);
Huann-Wu Chiang, New Taipei (TW);
Cheng-Shi Chen, New Taipei (TW);
Xiao-Qiang Chen, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 289 days.

(21) Appl. No.: 13/271,381

(22) Filed: Oct. 12, 2011

(65) Prior Publication Data

US 2012/0234719 A1  Sep. 20, 2012

(30) Foreign Application Priority Data

Mar. 14, 2011  (CN) .......................... 2011 1 0060707

(51) Int. Cl.
*B32B 15/04* (2006.01)
*B32B 15/20* (2006.01)
*B65D 85/00* (2006.01)
*B65D 85/86* (2006.01)
*C23C 14/34* (2006.01)
*C23C 30/00* (2006.01)
*C23C 14/16* (2006.01)
*C23C 14/00* (2006.01)
*C23C 14/35* (2006.01)
*C23C 14/58* (2006.01)

(52) U.S. Cl.
CPC ........... *C23C 14/0057* (2013.01); *C23C 14/165* (2013.01); *C23C 14/0084* (2013.01); *C23C 14/35* (2013.01); *C23C 14/5833* (2013.01)
USPC ...... 428/627; 428/610; 428/654; 204/192.15; 206/524.1

(58) Field of Classification Search
CPC ...... B32B 15/04; B32B 15/016; B32B 15/20;
C23C 14/0036; C23C 14/0084; C23C 14/35;
C23C 14/5833; C23C 14/0664; C23C 14/14;
C23C 14/16; C23C 14/165; C23C 16/36;
C23C 28/325; C23C 28/34; C23C 28/36;
C23C 30/00; C23C 30/005; C23C 14/00;
C23C 14/02; C23C 14/021; C23C 14/22;
C23C 14/221; C23C 14/24; C23C 14/34;
C23C 14/0057
USPC .................. 428/610, 627, 628, 650, 654;
204/192.1, 192.11, 192.12, 192.15
See application file for complete search history.

(56) References Cited

U.S. PATENT DOCUMENTS 5,045,971 A * 9/1991 Ono et al. .................. 361/704

* cited by examiner

*Primary Examiner* — Michael E La Villa
(74) *Attorney, Agent, or Firm* — Novak Druce Connolly Bove + Quigg LLP

(57) ABSTRACT

A device housing having an aluminum or aluminum alloy substrate, an aluminum layer and a corrosion resistant layer formed on the aluminum or aluminum alloy substrate in that order is provided. The corrosion resistant layer is an Al—C—N gradient layer implanted with iridium ions by ion implantation process. The atomic percentages of N and C in the Al—C—N gradient layer both gradually increase from the area near the aluminum layer to the area away from aluminum or aluminum alloy substrate. Therefore the device housing has a high corrosion resistance. A method for making the device housing is also provided.

14 Claims, 2 Drawing Sheets

2

DEVICE HOUSING AND METHOD FOR MAKING SAME

CROSS-REFERENCE TO RELATED APPLICATIONS

The disclosure of the listed applications are incorporated by reference in this application. The listed applications have the same assignee as the instant application.

| Serial number | Title | Inventors | Current Status |
|---|---|---|---|
| 13/271,382 | CORROSION RESISTANT HOUSING WITH IRIDIUM DOPED Al—O—N LAYER | CHANG et al. | Pending |
| 13/271,387 | DEVICE HOUSING AND METHOD FOR MAKING SAME | CHANG et al. | Abandoned |

BACKGROUND

1. Technical Field

The present disclosure relates to device housings and a method for making the same.

2. Description of Related Art

Due to properties such as light weight and quick heat dissipation, aluminum and aluminum alloy are widely used in manufacturing components (such as housings) of electronic devices. Aluminum and aluminum alloy are usually anodized to form an oxide coating thereon to achieve a decorative and wear-resistant surface. However, the anodizing process is complicated and not very effective.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary device housing and method for making the same. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
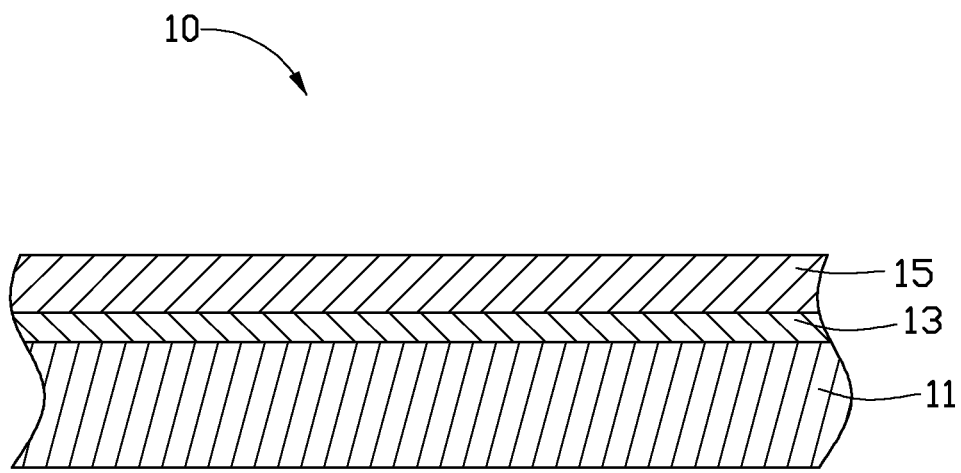
FIG. 1 illustrates a cross-sectional view of an exemplary embodiment of a device housing.

FIG. 1 shows a device housing 10 according to an exemplary embodiment. The device housing 10 includes a substrate 11 made of aluminum or aluminum alloy, an aluminum layer 13 formed on the substrate 11, and a corrosion resistant layer 15 formed on the aluminum layer 13.

The substrate 11 may be produced by punching. The aluminum layer 13 is substantially composed of aluminum and may be formed by vacuum sputtering, such as magnetron sputtering. The aluminum layer 13 may have a thickness of about 100 nanometers (nm)-300 nm. The aluminum layer 13 enhances the bond between the corrosion resistant layer 15 and the substrate 11. The corrosion resistant layer 15 is an aluminum-carbon-nitrogen (Al—C—N) gradient layer doped with iridium (Ir) ions implanted by an ion implantation process. The atomic percentages of nitrogen and carbon within the corrosion resistant layer 15 both gradually increase from the area near the aluminum layer 13 (or the substrate 11) to the area away from the aluminum layer 13 (or the substrate 11). The corrosion resistant layer 15 may have a thickness of about 0.5 micrometers (μm)-2.0 μm. The density of the iridium ions implanted in the Al—C—N gradient layer is about $1\times10^{16}$ ions per square centimeter (ions/cm²) to about $1\times10^{18}$ ions/cm².

An exemplary method for making the device housing 10 may include the following steps.

The substrate 11 made of aluminum or aluminum alloys is pre-treated. The pre-treating process may include the following steps.

The substrate 11 is cleaned with ethanol or acetone in an ultrasonic cleaner (not shown), to remove impurities such as grease or dirt from the substrate 11. Then, the substrate 11 is dried.

Figure 2:
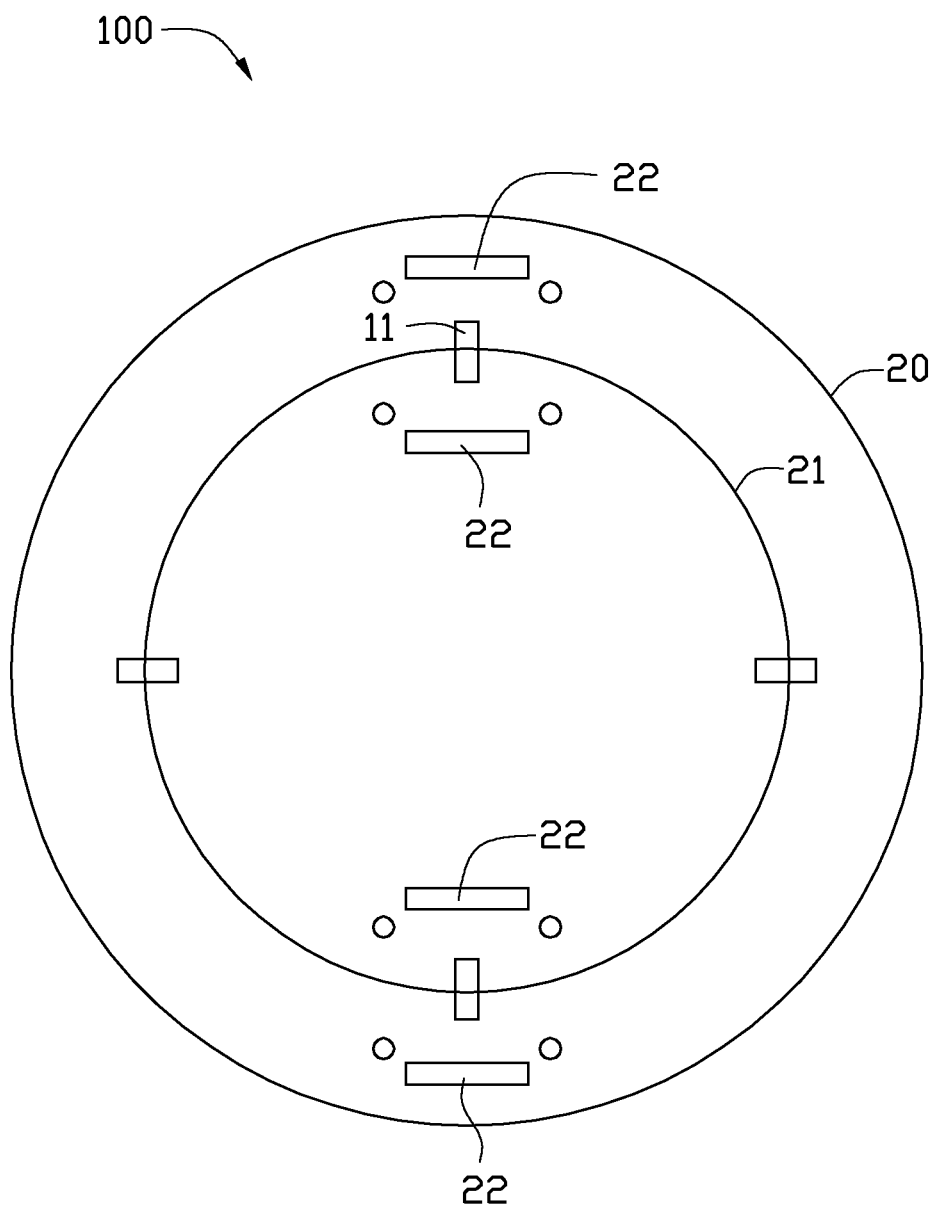
FIG. 2 is a schematic view of a vacuum sputtering device used for making the device housing in FIG. 1.

The substrate 11 is plasma cleaned. Referring to FIG. 2, the substrate 11 may be held on a rotating racket 21 in a vacuum chamber 20 of a vacuum sputtering device 100. Aluminum targets 22 are fixed in the vacuum chamber 20. The vacuum chamber 20 is then evacuated to about $8.0\times10^{-3}$ Pa. Argon gas having a purity of about 99.999% may be used as a sputtering gas and is fed into the vacuum chamber 20 at a flow rate of about 300 standard-state cubic centimeters per minute (sccm) to about 500 sccm. The substrate 11 is applied with a negative bias voltage of about −300 volts (V) to about −800 V. Argon gas is ionized to plasma. The plasma then strikes the surface of the substrate 11 to clean the surface of the substrate 11. The plasma cleaning process may take about a total of 3 minutes (min) to 10 min. The plasma cleaning process enhances the bond between the substrate 11 and the layers of the device housing 10. The aluminum targets 22 are not struck by the plasma during the plasma cleaning process.

The aluminum layer 13 may be vacuum sputtered on the pretreated substrate 11. In this exemplary embodiment, the aluminum layer 13 is formed by magnetron sputtering. Magnetron sputtering of the aluminum layer 13 is implemented in the vacuum chamber 20. Argon gas may be used as a sputtering gas and is fed into the vacuum chamber 20 at a flow rate of about 100 sccm-300 sccm. A bias voltage of about −300 V to about −500 V is applied to substrate 11. About 2 kW-8 kW of power at an intermediate frequency is then applied to the aluminum alloy targets 22, depositing the aluminum layer 13. Depositing of the aluminum layer 13 may take about a total of 5 min-10 min.

The corrosion resistant layer 15 is formed on the aluminum layer 13. Forming the corrosion resistant layer 15 may includes forming an Al—C—N gradient layer by a vacuum sputtering process, and then implanting iridium ions into the Al—C—N gradient layer by an ion implantation process.

In this exemplary embodiment, the Al—C—N gradient layer is formed by a magnetron sputtering process. An exemplary magnetron sputtering process for forming the Al—C—N gradient layer may be implemented in the vacuum chamber 20. Argon gas may be used as a sputtering gas and is fed into the vacuum chamber 20 at a flow rate of about 100 sccm-300 sccm. Nitrogen and acetylene may be used as reaction gases and are fed into the vacuum chamber 20, with the nitrogen at an initial flow rate of about 10 sccm-20 sccm and the acetylene at an initial flow rate of about 10 sccm-100 sccm. A bias voltage of about −150 V to about −500 V is applied to substrate 11 having the aluminum layer 13. About 2 kW-8 kW of power at an intermediate frequency is then applied to the aluminum targets 22, depositing the Al—C—N gradient layer on the aluminum layer 13. During the deposition process, the flow rates of the nitrogen and acetylene both increase at a rate of about 10 sccm to about 20 sccm every 10 min to about 15 min, enabling both the atomic percentages of carbon and nitrogen within the Al—C—N gradient layer increasing from the area near the aluminum layer 13 (or the substrate 11) to the area away from the aluminum layer 13 (or the substrate 11). Depositing of the Al—C—N gradient layer may take about a total of 30 min-90 min.

The Al—C—N gradient layer is then implanted with iridium ions by an ion implantation process. During the ion implantation process, the substrate 11 with the aluminum layer 11 and the Al—C—N gradient layer may be placed in a chamber of an ion implantation machine (not shown). Iridium metal is used to produce iridium ions. Gaseous iridium ions may be ionized from the iridium metal fixed in the ion implantation machine by applying a power. Then, the gaseous iridium ions may be accelerated by a high voltage electrical field, thereby forming a beam of iridium ions at a high energy of about tens of thousand electron volts to about hundreds of thousand electron volts. The beam of iridium ions is implanted into the Al—C—N gradient layer. The iridium implanted ions react with the atoms and molecules of the surface layer of the Al—C—N gradient layer, thereby forming the corrosion resistant layer 15. The iridium bonds with the Al—C—N gradient layer by implantation, and forms the amorphous property. The structural characteristics of amorphous includes isotropic, no dislocation, for example. Thus, the corrosion resistant layer 15 is a homogeneous amorphous film having a good corrosion resistance.

The ion implantation process may be carried out under the following conditions. The chamber of the ion implantation machine is evacuated to maintain an internal pressure of about $1\times10^{-4}$ Pa. The power applied for creating the gaseous iridium ions from the iridium metal may be controlled at about 30 kV to about 100 kV; the beam of iridium ions has an intensity of about 0.1 milliampere (mA) to about 5 mA. The density of the ions implanted in the Al—C—N gradient layer may be from about $1\times10^{16}$ ions/cm$^2$ to about $1\times10^{18}$ ions/cm$^2$. The chamber of the ion implantation machine may be maintained at a normal room temperature.

The atomic percentages of the carbon and nitrogen within the corrosion resistant layer 15 both are gradually increased from the bottom of the corrosion resistant layer 15 near the aluminum layer 13 (or the substrate 11) to the top of the corrosion resistant layer 15 away from the aluminum layer 13 (or the substrate 11). As such, the coefficients of thermal expansion of the corrosion resistant layer 15 is gradually increased from the bottom of the corrosion resistant layer 15 to the top of the corrosion resistant layer 15, such coefficient change of thermal expansion reduces the coefficient difference between the aluminum layer 13 and the corrosion resistant layer 15, which improves the bond between each of the layers of the device housing 10.

Furthermore, the corrosion resistant layer 15 is implanted with iridium ions. The implanted iridium ions can fill pores of the corrosion resistant layer 15 to increase the density of the corrosion resistant layer 15. The corrosion resistant layer 15 implanted with iridium ions is a homogeneous amorphous film. Thus, the corrosion resistance of the aluminum or aluminum alloy substrate 11 can be improved.

EXAMPLES

Specific examples of the present disclosure are described as follows. The pretreatment in these specific examples may be substantially the same as described above so it is not described here again. The specific examples mainly emphasize the different process parameters of the process for making the device housing.

Example 1

Plasma cleaning the substrate 11 made of a 2024-T351 type aluminum alloy: the flow rate of argon is 280 sccm; a bias voltage of −300 V is applied to the substrate 11; plasma cleaning of the substrate 11 takes about a total of 9 min.

Sputtering of the aluminum layer 13: the flow rate of argon is 100 sccm; a bias voltage of −500 V is applied to the substrate 11; about 2 kW of power at an intermediate frequency is applied to the aluminum targets 22; sputtering of the aluminum layer 13 takes about a total of 5 min.

Sputtering of the Al—C—N gradient layer: the flow rate of argon is about 100 sccm, the initial flow rate of acetylene is about 10 sccm, and the initial flux of the nitrogen is about 10 sccm; a bias voltage about −500 V is applied to the substrate; about 2 kW of power at an intermediate frequency is applied to the aluminum targets 22; during sputtering of the Al—C—N gradient layer, both the nitrogen and acetylene flow rates increase at a rate of about 10 sccm every 10 min. The depositing of the Al—C—N gradient layer takes about a total of 30 min.

Implanting iridium ions into the Al—C—N gradient layer: the chamber of the ion implantation machine maintains an internal pressure of about $1\times10^{-4}$ Pa; the power applied for creating gaseous iridium ions from the iridium metal is about 30 kV; the beam of iridium ions has an intensity of about 0.1 mA; the density of the ions implanted in the Al—C—N gradient layer may be from about $1\times10^{16}$ ions/cm$^2$.

Example 2

Plasma cleaning the substrate 11 made of a 5052-H112 type aluminum alloy: the flow rate of argon is 230 sccm; a bias voltage of −480 V is applied to the substrate 11; plasma cleaning of the substrate 11 takes about a total of 7 min.

Sputtering of the aluminum layer 13: the flow rate of argon is 200 sccm; a bias voltage of −400 V is applied to the substrate 11; about 5 kW of power at an intermediate frequency is applied to the aluminum targets 22; sputtering of the aluminum layer 13 takes about a total of 7 min.

Sputtering of the Al—C—N gradient layer: the flow rate of argon is about 200 sccm, the initial flow rate of nitrogen is about 15 sccm, and the initial flux of the acetylene is about 60 sccm; a bias voltage about −300 V is applied to the substrate; about 5 kW of power at an intermediate frequency is applied to the aluminum targets 22; during sputtering of the Al—C—N gradient layer, both the nitrogen and acetylene flow rates increase at a rate of about 15 sccm every 12 min. The depositing of the Al—C—N gradient layer takes about a total of 60 min.

Implanting iridium ions into the Al—C—N gradient layer: the chamber of the ion implantation machine maintains an internal pressure of about $1\times10^{-4}$ Pa; the power applied for creating gaseous iridium ions from the iridium metal is about 60 kV; the beam of iridium ions has an intensity of about 2 mA; the density of the ions implanted in the Al—C—N gradient layer may be from about $1\times10^{17}$ ions/cm$^2$.

Example 3

Plasma cleaning the substrate 11 made of a 6061-T651 type aluminum alloy: the flow rate of argon is 160 seem; a bias voltage of −400 V is applied to the substrate 11; plasma cleaning of the substrate 11 takes about a total of 6 min.

Sputtering of the aluminum layer 13: the flow rate of argon is 300 sccm; a bias voltage of −300 V is applied to the substrate 11; about 8 kW of power at an intermediate frequency is applied to the aluminum targets 22; sputtering of the aluminum layer 13 takes about a total of 10 min.

Sputtering of the Al—C—N gradient layer: the flow rate of argon is about 300 sccm, the initial flow rate of nitrogen is about 20 sccm, and the initial flux of acetylene is about 100 sccm; a bias voltage about −150 V is applied to the substrate; about 8 kW of power at an intermediate frequency is applied to the aluminum targets 22; during sputtering of the Al—C—N gradient layer, both the nitrogen and acetylene flow rates increase at a rate of about 20 sccm every 15 min. The depositing of the Al—C—N gradient layer takes about a total of 90 min.

Implanting iridium ions into the Al—C—N gradient layer: the chamber of the ion implantation machine maintains an internal pressure of about $1 \times 10^{-4}$ Pa; the power applied for creating gaseous iridium ions from the iridium metal is about 100 kV; the beam of iridium ions has an intensity of about 5 mA; the density of the ions implanted in the Al—C—N gradient layer may be from about $1 \times 10^{18}$ ions/cm$^2$.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A device housing, comprising:
   a substrate made of aluminum or aluminum alloy;
   an aluminum layer formed on the substrate; and
   a corrosion resistant layer formed on the aluminum layer;
   wherein the corrosion resistant layer is an Al—C—N gradient layer doped with iridium ions and wherein the atomic percentages of N and C in the Al—C—N gradient layer both gradually increase from a bottom of the corrosion resistant layer near the aluminum layer to a top of the corrosion resistant layer extending along a thickness direction of the corrosion resistant layer away from the aluminum layer.

2. The device housing as claimed in claim 1, wherein the density of the iridium ions implanted in the Al—C—N gradient layer is about $1 \times 10^{16}$ ions/cm$^2$ to about $1 \times 10^{18}$ ions/cm$^2$.

3. The device housing as claimed in claim 1, wherein the corrosion resistant layer has a thickness of about 0.5 μm to about 2.0 μm.

4. The device housing as claimed in claim 1, wherein the aluminum layer has a thickness of about 100 nm to about 300 nm.

5. A method for making a device housing, the method comprising:
   providing a substrate made of aluminum or aluminum alloy;
   forming an aluminum layer on the substrate by vacuum sputtering; and
   forming a corrosion resistant layer on the aluminum layer, the corrosion resistant layer being an Al—C—N gradient layer doped with iridium ions, the atomic percentages of N and C in the Al—C—N gradient layer both gradually increasing from a bottom of the corrosion resistant layer near the aluminum layer to a top of the corrosion resistant layer extending along a thickness direction of the corrosion resistant layer away from the aluminum layer.

6. The method as claim in claim 5, wherein the aluminum layer is formed by magnetron sputtering.

7. The method as claim in claim 6, wherein magnetron sputtering of the aluminum layer uses argon at a flow rate of about 100 sccm to about 300 sccm as a sputtering gas; applies a power of about 2 kW to about 8 kW to aluminum targets; applies a bias voltage of about −300 V to about −500 V to the substrate; and takes a total of about 5 min. to about 10 min.

8. The method as claim in claim 5, wherein forming the corrosion resistant layer comprises: forming an Al—C—N gradient layer by a vacuum sputtering process; and implanting the iridium ions into the Al—C—N gradient layer by an ion implantation process.

9. The method as claim in claim 8, wherein the Al—C—N gradient layer is formed by magnetron sputtering.

10. The method as claim in claim 9, wherein magnetron sputtering of the Al—C—N gradient layer uses argon at a flow rate of about 100 sccm to about 300 sccm as a sputtering gas; uses acetylene and nitrogen as reaction gases, with the acetylene at an initial flow rate of about 10 sccm to about 100 sccm and the nitrogen at an initial flow rate of about 10 sccm to about 20 sccm; applies a power of about 2 kW-8 kW to aluminum targets; and applies a bias voltage of about −150 V to about −500 V to the substrate with the aluminum layer; wherein during the magnetron sputtering process, the flow rates of the nitrogen and acetylene both increase at a rate of about 10 sccm to about 20 sccm every 10 min. to about 15 min.; and wherein magnetron sputtering of the Al—C—N gradient layer takes a total of about 30 min. to about 90 min.

11. The method as claim in claim 8, wherein during the step of implanting the iridium ions into the Al—C—N gradient layer, gaseous iridium ions are ionized from iridium metal by applying a power of about 30 kV to about 100 kV; the gaseous iridium ions are accelerated by an electrical field, thereby forming a beam of iridium ions having an intensity of about 0.1 mA to about 5 mA; and the beam of iridium ions is implanted into the Al—C—N gradient layer.

12. The method as claim in claim 5, wherein the density of the iridium ions implanted in the Al—C—N gradient layer is about $1 \times 10^{16}$ ions/cm$^2$ to about $1 \times 10^{18}$ ions/cm$^2$.

13. The method as claimed in claim 5, further comprising a step of pre-treating the substrate before forming the aluminum layer.

14. The method as claimed in claim 13, wherein the pre-treating step comprises ultrasonic cleaning the substrate and plasma cleaning the substrate.

* * * * *